US012763794B2

(12) United States Patent
Huang et al.

(10) Patent No.: US 12,763,794 B2
(45) Date of Patent: Oct. 13, 2026

(54) DATA COMPRESSION METHOD AND DATA DECOMPRESSION DEVICE CORRESPONDING THERETO

(71) Applicant: National Yang Ming Chiao Tung University, Hsinchu City (TW)

(72) Inventors: Juinn-Dar Huang, Zhubei City (TW); Lyu-Ming Ho, Hsinchu City (TW); Chih-Yao Liang, Hsinchu City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 142 days.

(21) Appl. No.: 19/008,214

(22) Filed: Jan. 2, 2025

(65) Prior Publication Data

US 2026/0066923 A1 Mar. 5, 2026

(30) Foreign Application Priority Data

Sep. 3, 2024 (TW) ................................ 113133185

(51) Int. Cl.
*H03M 7/40* (2006.01)

(52) U.S. Cl.
CPC ........... *H03M 7/40* (2013.01); *H03M 7/4056* (2013.01)

(58) Field of Classification Search
CPC .... H03M 7/40; H03M 7/4056; H03M 7/3079; H03M 7/00; H03M 7/4031

(Continued)

(56) References Cited

U.S. PATENT DOCUMENTS 6,618,506 B1 * 9/2003 Auerbach ............... H03M 7/30 712/210
2010/0085221 A1 * 4/2010 Monro .................... H03M 7/40 341/67

(Continued)

FOREIGN PATENT DOCUMENTS

CN 104040899 B 12/2016

OTHER PUBLICATIONS

Hashemian, "Memory Efficient and High-speed Search Huffman Coding", IEEE Transactions on Communications, Oct. 1995, vol. 43, No. 10, pp. 2576-2581.

(Continued)

*Primary Examiner* — Peguy Jean Pierre
(74) *Attorney, Agent, or Firm* — Birch, Stewart, Kolasch & Birch, LLP

(57) ABSTRACT

The disclosure describes a data compression method and a data decompression device corresponding thereto. Firstly, the first frequencies of occurrence of different original codewords are calculated, wherein each original codeword has at least two sub-words and each sub-word has at least one bit. Then, each original codeword is decomposed into sub-words. Based on the first frequencies, the second frequencies of occurrence of all different sub-words are calculated. Variable-length encoding is performed on all different sub-words in a compression manner to generate different compression codes corresponding to all different sub-words. Finally, based on the corresponding relationship between the compression codes and all different sub-words, the original codewords are converted into encoded codewords. Besides, before performing variable-length encoding on the sub-words, the sub-words of the original codewords may be recoded.

11 Claims, 5 Drawing Sheets

(58) Field of Classification Search
USPC .......................................... 341/50, 67, 65, 51
See application file for complete search history.

(56) References Cited

U.S. PATENT DOCUMENTS

| | | | | |
|---|---|---|---|---|
| 2012/0242517 | A1* | 9/2012 | Seo ......................... | H03M 7/40 341/52 |
| 2017/0031665 | A1* | 2/2017 | Mantri ...................... | G06F 8/65 |

OTHER PUBLICATIONS

Malach et al., "Hardware-Based Real-Time Deep Neural Network Lossless Weights Compression", IEEE Access, 2020, vol. 8, pp. 205051-205060.

* cited by examiner

DATA COMPRESSION METHOD AND DATA DECOMPRESSION DEVICE CORRESPONDING THERETO

BACKGROUND OF THE INVENTION

This application claims priority for the TW patent application No. 113133185 filed on 3 Sep. 2024, the content of which is incorporated by reference in its entirely.

FIELD OF THE INVENTION

The present invention relates to the technology for compressing and decompressing data, particularly to a data compression method and a decompression device corresponding thereto.

DESCRIPTION OF THE RELATED ART

In the era of vigorous development of deep learning, the application of various artificial intelligences is accompanied by the development of technology and gradually integrated into daily life. The most popular generative artificial intelligence (AI) models currently play a pivotal role, such as image generation models, audio and video generation models, multi-mode generation models, large language models, etc. As the neural network model architecture becomes more and more complex, the model size (i.e., the number of parameters) and the amount of calculation required for multiplication and accumulation are also increasing, making it difficult for edge devices to deploy model applications with a large number of parameters.

In the existing technology, there is a trade-off between compression rate and hardware cost. Therefore, the hardware architecture is relatively complex. Besides, the hardware architecture cannot perform real-time decoding and expand the scale. In addition, the existing technology also requires extremely large memory capacities. For example, after lossless compression is performed on data, the longest encoded data has 13 bits. Thus, the memory capacity requires 213 memory locations by simply passing the encoded data string as the memory addresses. In edge devices, requiring huge memory capacity is not a friendly and reasonable manner. Furthermore, in the existing technology, it is impossible to ensure that the corresponding correct data is decoded in every clock cycle. Therefore, the subsequent circuit design will possibly process complex control states.

To overcome the abovementioned problems, the present invention provides a data compression method and a decompression device corresponding thereto, so as to solve the afore-mentioned problems of the prior art.

SUMMARY OF THE INVENTION

The present invention provides a data compression method and a decompression device corresponding thereto, which reduce data access space without sacrificing prediction accuracy, such that the inference of large-parameter models could be performed on resource-constrained edge devices.

In an embodiment of the invention, a data compression method includes: calculating the first frequencies of occurrence of different original codewords, wherein each of the original codewords has at least two sub-words and each of the sub-words has at least one bit; decomposing each of the original codewords into the sub-words and calculating the second frequencies of occurrence of all the different sub-words based on the first frequencies; performing variable-length coding on all the different sub-words in a compression manner to respectively generate different compression codes corresponding to all the different sub-words, wherein the coding length of the compression code corresponding to the higher second frequency is less than or equal to the coding length of the compression code corresponding to the lower second frequency; and respectively converting the original codewords into encoded codewords based on a corresponding relationship between the compression codes and all the different sub-words. The data compression method simplifies the complexity of the decoder by decomposing an original codeword into multiple sub-codewords, thereby significantly reducing the required hardware cost and increasing circuit speed.

In an embodiment of the invention, the compression manner is lossless compression manner.

In an embodiment of the invention, the original codewords are the quantized parameters of a large language model (LLM).

In an embodiment of the invention, a data decompression device applied to the data compression method includes a first decoder, a first shifter, at least one second decoder, and at least one second shifter. The first decoder is configured to receive the encoded codeword, convert the first partial bits of the encoded codeword into the sub-words based on the corresponding relationship between the compression codes and all the different sub-words, and outputs the first partial bits and the sub-words corresponding thereto. The first shifter is coupled to the first decoder and configured to receive the encoded codeword and remove the first partial bits from the encoded codeword to output the first remaining bits of the encoded codeword. The second decoder is coupled to the first shifter and the first decoder and configured to receive the first remaining bits of the encoded codeword and convert the second partial bits of the encoded codeword into the sub-words based on the corresponding relationship between the compression codes and all the different sub-words, and outputs the second partial bits and the sub-words corresponding thereto. The second shifter is coupled to the first shifter, the second decoder, and the first decoder and configured to receive the first remaining bits of the encoded codeword and remove the second partial bits from the first remaining bits of the encoded codeword to output the second remaining bits of the encoded codeword. The decoder, using the foregoing algorithm, can smoothly decode the corresponding data in every clock cycle at extremely high clock speeds. It is very suitable for use in edge devices and artificial intelligence computing acceleration tasks that require high computing amounts.

In an embodiment of the invention, a data compression method includes: calculating the first frequencies of occurrence of different original codewords, wherein each of the original codewords has at least two sub-words and each of the sub-words has at least one bit; calculating the second frequencies of occurrence of all the different sub-words based on the first frequencies; recoding the sub-words of the original codewords; decomposing each of the original codewords into the at least two recoded sub-words; calculating the third frequencies of occurrence of all the different recoded sub-words based on the first frequencies, wherein the distribution of the third frequencies corresponding to all the different recoded sub-words is more extreme than the distribution of the second frequencies corresponding to all the different unrecoded sub-words; performing variable-length coding on all the different recoded sub-words in a compression manner to respectively generate different compression codes corresponding to all the different recoded sub-words, wherein the coding length of the compression code corresponding to the higher third frequency is less than or equal to the coding length of the compression code corresponding to the lower third frequency; and respectively converting the original codewords into encoded codewords based on a corresponding relationship between the compression codes and all the different recoded sub-words. The data compression method recodes the original codewords to make the probability distribution of the sub-words more extremely uneven to further increase the compression ratio of lossless encoding.

In an embodiment of the invention, the bits of the different compression codes have a first total quantity. Variable-length coding is performed on all the different unrecoded sub-words in the compression manner to respectively generate different reference compression codes corresponding to all the different unrecoded sub-words. The coding length of the reference compression code corresponding to the higher second frequency is less than or equal to the coding length of the reference compression code corresponding to the lower second frequency. The bits of the different reference compression codes have a second total quantity, wherein the second total quantity is greater than the first total quantity.

In an embodiment of the invention, a data decompression device applied to the data compression method includes a first decoder, a first shifter, at least one second decoder, at least one second shifter, and a code mapper. The first decoder is configured to receive the encoded codeword, convert the first partial bits of the encoded codeword into the recoded sub-words based on the corresponding relationship between the compression codes and all the different recoded sub-words, and output the first partial bits and the recoded sub-words corresponding thereto. The first shifter is coupled to the first decoder and configured to receive the encoded codeword and remove the first partial bits from the encoded codeword to output the first remaining bits of the encoded codeword. The second decoder is coupled to the first shifter and configured to receive the first remaining bits of the encoded codeword and convert the second partial bits of the encoded codeword into the recoded sub-words based on the corresponding relationship between the compression codes and all the different recoded sub-words, and output the second partial bits and the recoded sub-words corresponding thereto. The second shifter is coupled to the first shifter, the second decoder, and the first decoder and configured to receive the first remaining bits of the encoded codeword and remove the second partial bits from the first remaining bits of the encoded codeword to output the second remaining bits of the encoded codeword. The code mapper is coupled to the first decoder and the second decoder and configured to convert the recoded sub-words into the original codeword based on a corresponding relationship between the original codewords and all the different recoded sub-words.

To sum up, the data compression method and the decompression device corresponding thereto compress and decompress model parameters and reduce data access space without sacrificing prediction accuracy, such that the inference of large-parameter models could be performed on resource-constrained edge devices.

Below, the embodiments are described in detail in cooperation with the drawings to make easily understood the technical contents, characteristics and accomplishments of the invention.

DETAILED DESCRIPTION OF THE INVENTION

Figure 1:
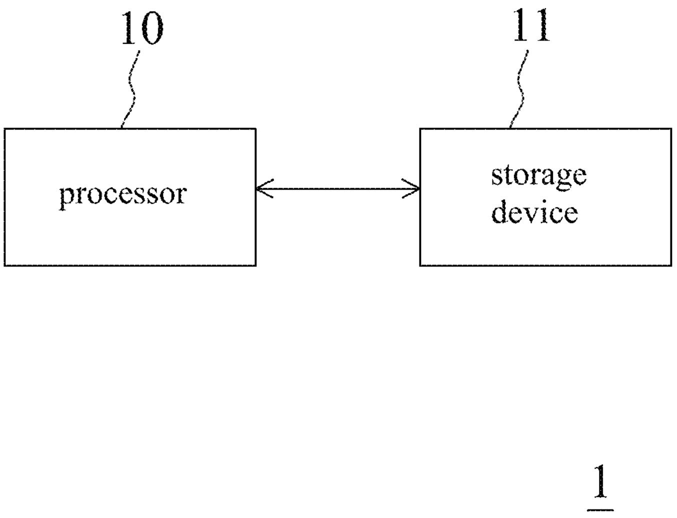
FIG. 1 is a diagram schematically illustrating a data compression device according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as “can”, “could”, “might”, or “may”, usually attempt to express that the embodiment in the invention has, but it can also be interpreted as a feature, element, or step that may not be needed. In other embodiments, these features, elements, or steps may not be required.

Reference throughout this specification to “one embodiment” or “an embodiment” means that a particular feature, structure, or characteristic described in connection with the embodiment is included in at least one embodiment. Thus, the appearances of the phrases “in one embodiment” or “in an embodiment” in various places throughout this specification are not necessarily all referring to the same embodiment.

Certain terms used in the description and the claims refer to particular components. Those skilled in the art appreciate that a component may be referred to as different names. This disclosure does not intend to distinguish between components that differ in name but not in function. In the description and in the claims, the term “comprise” is used in an open-ended fashion, and thus should be interpreted to mean “include, but not limited to.” The phrases “be coupled to,” “couples to,” and “coupling to” are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a data compression method and a decompression device corresponding thereto will be provided. The data compression method and the decompression device compress and decompress model parameters and reduce data access space without sacrificing prediction accuracy, such that the inference of large-parameter models could be performed on resource-constrained edge devices.

FIG. 1 is a diagram schematically illustrating a data compression device according to an embodiment of the present invention. Referring to FIG. 1, a data compression device 1 includes a processor 10 and a storage device 11. The processor 10 is coupled to the storage device 11. The storage device 11 stores original codewords. The original codewords may be the quantized parameters of a large language model (LLM), but the present invention is not limited thereto.

Figure 2:
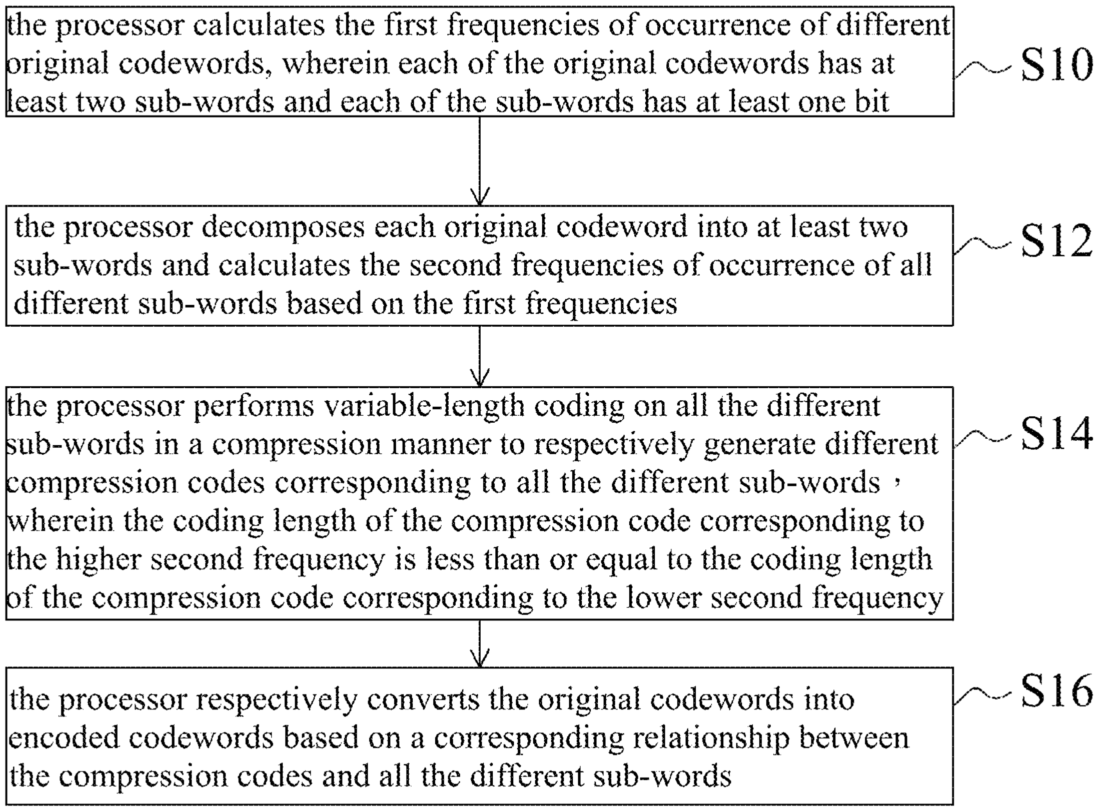
FIG. 2 is a flowchart of a data compression method according to an embodiment of the present invention.

FIG. 2 is a flowchart of a data compression method according to an embodiment of the present invention. Referring to FIG. 1 and FIG. 2, an embodiment of the data compression method will be introduced as follows. Firstly, in Step S10, the processor 10 calculates the first frequencies of occurrence of different original codewords. Each of the original codewords has at least two sub-words and each of the sub-words has at least one bit. Each original codeword complies with equation (1).

$$Y = \sum_{i=1}^{N} xi \tag{1}$$

Y represents the original codeword, N represents the number of the sub-words, and xi represents the length of the i-th sub-word. The total quantity of bits of all the sub-words is equal to the number of bits of the original codeword.

For convenience and clarity, each original codeword has two sub-words, which is used as an example. Each sub-word has two bits and each original codeword has four bits. As shown in Table 1, the original codewords include 0000, 0001, 1111, 0010, 1110, 0011, and 1101. The original codeword 0000 appears 48 times. The original codeword 0001 appears 31 times. The original codeword 1111 appears 7 times. The original codeword 0010 appears 6 times. The original codeword 1110 appears 5 times. The original codeword 0011 appears 2 times. The original codeword 1101 appears once. In other words, the first frequencies of the original codewords 0000, 0001, 1111, 0010, 1110, 0011, and 1101 are 48, 31, 7, 6, 5, 2, and 1 times respectively. The sub-words of the original codeword 0000 include 00 and 00. The sub-words of the original codeword 0001 include 00 and 01. The sub-words of the original codeword 1111 include 11 and 11. The sub-words of the original codeword 0010 include 00 and 10. The sub-words of the original codeword 1110 include 11 and 10. The sub-words of the original codeword 0011 include 00 and 11. The sub-words of the original codeword 1101 include 11 and 01.

TABLE 1

| Original codeword | First frequency | Sub-word | Sub-word |
|---|---|---|---|
| 0000 | 48 | 00 | 00 |
| 0001 | 31 | 00 | 01 |
| 1111 | 7 | 11 | 11 |
| 0010 | 6 | 00 | 10 |
| 1110 | 5 | 11 | 10 |
| 0011 | 2 | 00 | 11 |
| 1101 | 1 | 11 | 01 |

As shown in Step S12 and Table 1, the processor 10 decomposes each original codeword into at least two sub-words and calculates the second frequencies of occurrence of all different sub-words based on the first frequencies. As shown in Table 1, all different sub-words include 00, 01, 10, and 11. Based on the first frequency, the second frequency of occurrence are: 135 times for sub-word 00, 32 times for sub-word 01, 11 times for sub-word 10, and 22 times for sub-word 11, as shown in Table 2.

TABLE 2

| Sub-word | Second frequency | Compression code |
|---|---|---|
| 00 | 135 | 0 |
| 01 | 32 | 10 |
| 10 | 11 | 110 |
| 11 | 22 | 111 |

In Step S14, the processor 10 performs variable-length coding on all the different sub-words in a compression manner to respectively generate different compression codes corresponding to all the different sub-words. The compression manner may be a lossless compression manner, such as Huffman coding, but the present invention is not limited thereto. The coding length of the compression code corresponding to the higher second frequency is less than or equal to the coding length of the compression code corresponding to the lower second frequency. Thus, the lossless compression manner has a prefix property. When the lossless compression manner is Huffman coding, the compression codes are Huffman codes. As shown in Table 2, the compression codes are as follows: 0 for sub-word 00, 10 for sub-word 01, 110 for sub-word 10, and 111 for sub-word 11.

In Step S16, the processor 10 respectively converts the original codewords into encoded codewords based on a corresponding relationship between the compression codes and all the different sub-words. Based on the corresponding relationship between Table 1 and Table 2, the original codewords are converted into encoded codewords as follows: 0000→00, 0001→010, 1111→111111, 0010→0110, 1110→111110, 0011→0111, and 1101→11110.

Because (48×4)+(31×4)+(7×4)+(6×4)+(5×4)+(2×4)+(1×4)=400, all original codewords have 400 bits. According to Table 2, all compression codes have 298 bits. This is because (135×1)+(32×2)+(11×3)+(22×3)=298. Therefore, compression ratio=1−(298/400)=25.5%. As a result, the data compression method compresses and decompresses model parameters and reduces data access space without sacrificing prediction accuracy, such that the inference of large-parameter models is performed on resource-constrained edge devices. Provided that substantially the same result is achieved, the steps of the flowchart shown in FIG. 2 need not be in the exact order shown and need not be contiguous, that is, other steps can be intermediate.

If Huffman coding is directly performed on all original codewords, the Huffman codes corresponding to the original codewords are shown in Table 3. From Table 3 and Table 2, one can see that the most number of bits that need to be decoded changes from 5 to 3. In this way, the data compression method simplifies the complexity of the decoder by decomposing one original codeword into multiple sub-words, thereby significantly reducing the required hardware cost and increasing circuit speed. The decoder, using the foregoing algorithm, can smoothly decode the corresponding data in every clock cycle at extremely high clock speeds. It is very suitable for the use in edge devices and artificial intelligence computing acceleration tasks that require high computing amounts.

TABLE 3

| Original codeword | Huffman code |
|---|---|
| 0000 | 0 |
| 0001 | 10 |
| 1111 | 1100 |
| 0010 | 1101 |
| 1110 | 1110 |
| 0011 | 11110 |
| 1101 | 11111 |

Figure 3:
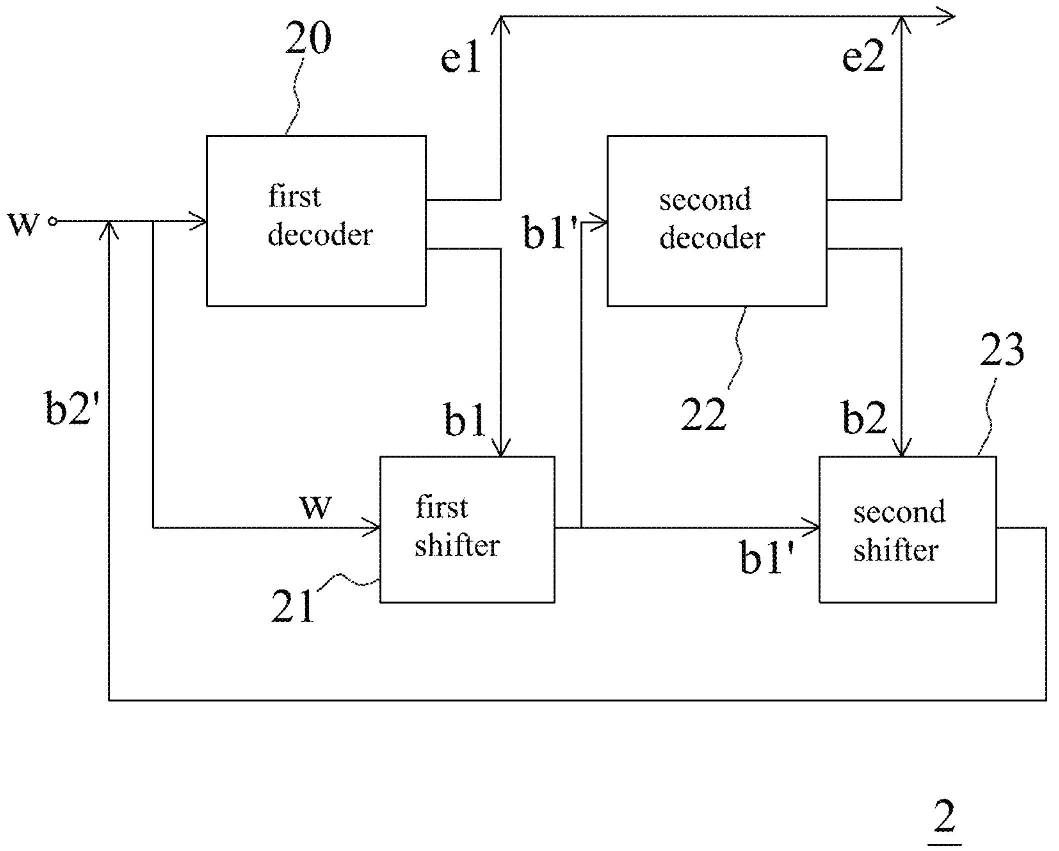
FIG. 3 is a diagram schematically illustrating a data decompression device according to an embodiment of the present invention.

FIG. 3 is a diagram schematically illustrating a data decompression device according to an embodiment of the present invention. Referring to FIG. 3, an embodiment of the data decompression device is introduced as follows. The data decompression device 2 includes a first decoder 20, a first shifter 21, at least one second decoder 22, and at least one second shifter 23. For convenience and clarity, the embodiment exemplifies one second decoder 22 and one second shifter 23. The first shifter 21 is coupled to the first decoder 20. The second decoder 22 is coupled to the first shifter 21 and the first decoder 20. The second shifter 23 is coupled to the first shifter 21, the second decoder 22, and the first decoder 20. The first decoder 20 receives the encoded codeword w, converts the first partial bits b1 of the encoded codeword w into the sub-words e1 based on the corresponding relationship between the compression codes and all the different sub-words, and outputs the first partial bits b1 and the sub-words e1 corresponding thereto. For example, the encoded codeword w is 1111100. The first decoder 20 decodes the encoded codeword w from left to right. Thus, the first partial bits b1 and the sub-words e1 corresponding thereto respectively include 111 and 11. The first shifter 21 receives the encoded codeword w and removes the first partial bits b1 from the encoded codeword w to output the first remaining bits b1' of the encoded codeword w. Since the first partial bits b1 include 111, the first remaining bits b1' include 1100. The second decoder 22 receives the first remaining bits b1' of the encoded codeword w and converts the second partial bits b2 of the encoded codeword w into the sub-words b2 based on the corresponding relationship between the compression codes and all the different sub-words, and outputs the second partial bits b2 and the sub-words e2 corresponding thereto. In the embodiment, the second partial bits b2 and the sub-words e2 corresponding thereto respectively include 110 and 10. The second shifter 23 receives the first remaining bits b1' of the encoded codeword w and removes the second partial bits b2 from the first remaining bits b1' of the encoded codeword w to output the second remaining bits b2' of the encoded codeword w. In the embodiment, the second remaining bits b2' include 0. As a result, the first decoder 20 and the second decoder 22 finally output the original codeword 1110 including sub-words e1 and e2.

Figure 4:
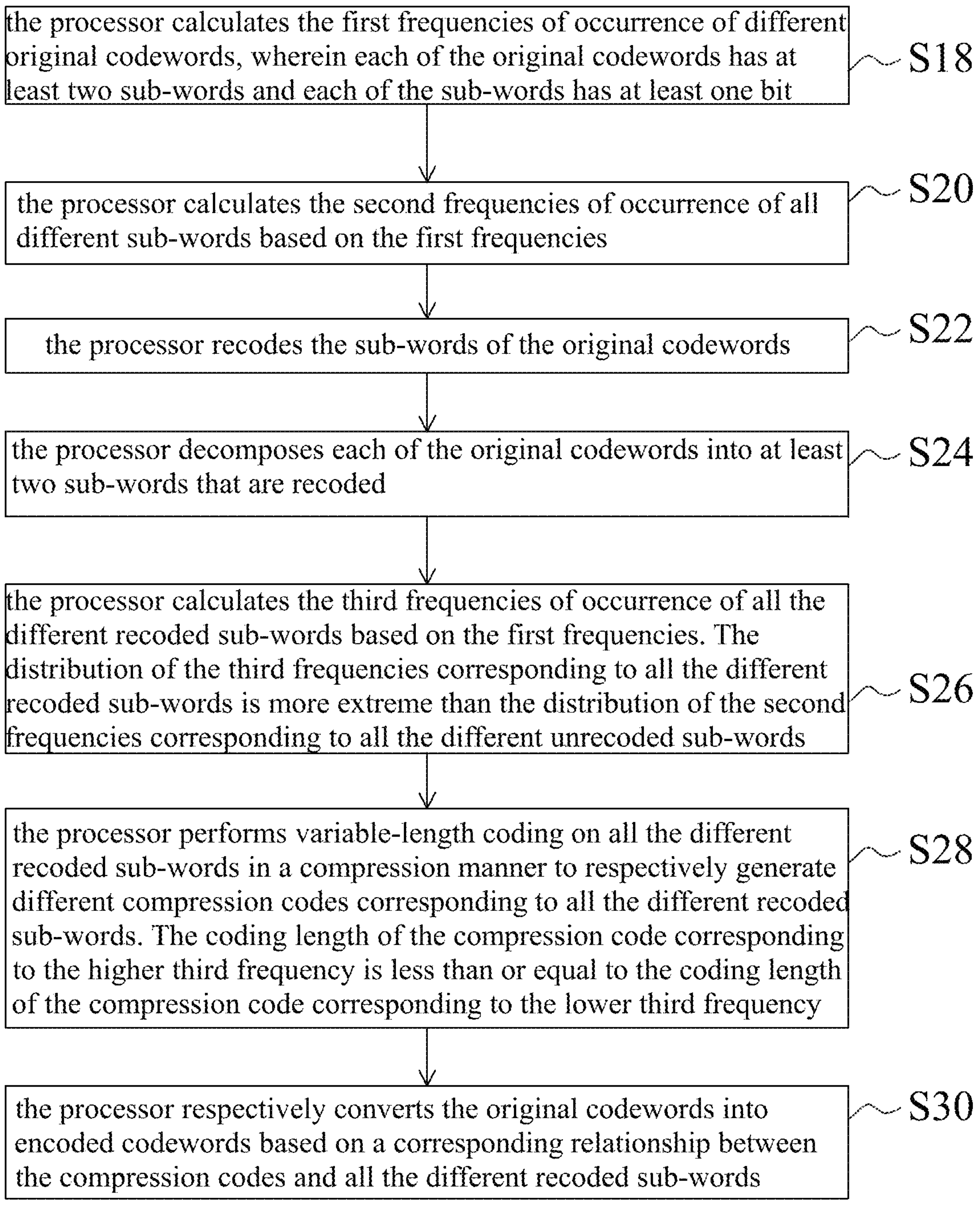
FIG. 4 is a flowchart of a data compression method according to another embodiment of the present invention.

FIG. 4 is a flowchart of a data compression method according to another embodiment of the present invention. Referring to FIG. 1 and FIG. 4, another embodiment of the data compression method is introduced as follows. Firstly, in Step S18, the processor 10 calculates the first frequencies of occurrence of different original codewords. Each original codeword has at least two sub-words and each sub-word has at least one bit. For convenience and clarity, each original codeword has two sub-words, which is used as an example. Each sub-word has two bits and each original codeword has four bits, as shown in Table 1. Then, in Step S20, the processor 10 calculates the second frequencies of occurrence of all different sub-words based on the first frequencies, as shown in Table 2. In Step S22, the processor 10 recodes the sub-words of the original codewords. For example, the processor 10 recodes the sub-words of the original codewords based on an encoding condition. The encoding condition defines that the original codeword corresponding to the higher first frequency is represented by the sub-words corresponding to the higher second frequency, and that the original codeword corresponding to the lower first frequency is represented by the sub-words corresponding to the lower second frequency. From Table 2, it is known that the second frequency of the sub-word 00 is greater than the second frequency of the sub-word 01, that the second frequency of the sub-word 01 is greater than the second frequency of the sub-word 11, and that the second frequency of the sub-word 11 is greater than the second frequency of the sub-word 10. In other words, the original codeword corresponding to the higher first frequency should be represented by the sub-words 00 and 01 as much as possible. The original codeword corresponding to the lower first frequency should be represented by the sub-words 11 and 10 as much as possible. As shown in Table 4, the original codewords are represented by recoded sub-words as follows: 0000→00, 00; 0001→00, 01; 1111→01, 00; 0010→01, 01; 1110→00, 10; 0011→10, 00; and 1101→01, 10.

TABLE 4

| Original codeword | First frequency | Unrecoded sub-word | Unrecoded sub-word | Recoded sub-word | Recoded sub-word |
|---|---|---|---|---|---|
| 0000 | 48 | 00 | 00 | 00 | 00 |
| 0001 | 31 | 00 | 01 | 00 | 01 |
| 1111 | 7 | 11 | 11 | 01 | 00 |
| 0010 | 6 | 00 | 10 | 01 | 01 |
| 1110 | 5 | 11 | 10 | 00 | 10 |
| 0011 | 2 | 00 | 11 | 10 | 00 |
| 1101 | 1 | 11 | 01 | 01 | 10 |

As shown in Step S24 and Table 4, the processor 10 decomposes each of the original codewords into the at least two sub-words that are recoded. In Step S26, the processor 10 calculates the third frequencies of occurrence of all the different recoded sub-words based on the first frequencies.

The distribution of the third frequencies corresponding to all the different recoded sub-words is more extreme than the distribution of the second frequencies corresponding to all the different unrecoded sub-words. As shown in Table 5, all the different recoded sub-words include 00, 01, 10, and 11. Based on the first frequencies, the third frequency of occurrence are: 141 times for the recoded sub-word 00, 51 times for the recoded sub-word 01, 8 times for the recoded sub-word 10, and 0 for the recoded sub-word 11. When Table 3 is compared with Table 2, the third frequencies corresponding to sub-words 00 and 01 are respectively higher than the second frequencies corresponding to sub-words 00 and 01, and the third frequencies corresponding to sub-words 10 and 11 are respectively lower than the second frequencies corresponding to sub-words 00 and 01.

TABLE 5

| Sub-word | Third frequency | Compression code |
|---|---|---|
| 00 | 141 | 0 |
| 01 | 51 | 10 |
| 10 | 8 | 11 |
| 11 | 0 | X |

In Step S28, the processor 10 performs variable-length coding on all the different recoded sub-words in a compression manner to respectively generate different compression codes corresponding to all the different recoded sub-words. The coding length of the compression code corresponding to the higher third frequency is less than or equal to the coding length of the compression code corresponding to the lower third frequency. The compression manner may be a lossless compression manner, but the present invention is not limited thereto. When the lossless compression manner is Huffman coding, the compression codes are Huffman codes. As shown in Table 5, the compression codes corresponding to the recoded sub-words are: 0 for 00, 10 for 01, and 11 for 10.

In Step S30, the processor 10 respectively converts the original codewords into encoded codewords based on a corresponding relationship between the compression codes and all the different recoded sub-words. Provided that the same result is substantially achieved, the steps of the flowchart shown in FIG. 4 need not be in the exact order shown and need not be contiguous, that is, other steps can be intermediate.

Based on the corresponding relationship between Table 4 and Table 5, the original codewords are converted into the encoded codewords as follows: 0000→00, 0001→010, 1111→100, 0010→1010, 1110→011, 0011→110, and 1101→1011.

Because (48×4)+(31×4)+(7×4)+(6×4)+(5×4)+(2×4)+(1×4)=400, all original codewords have 400 bits. According to Table 5, all compression codes have 259 bits. That is to say, the bits of all different compression codes have a first total quantity that is equal to 259. This is because (141×1)+(51×2)+(8×2)=259. Therefore, the compression ratio=1-(259/400)=35.25%. Therefore, without sacrificing prediction accuracy, the data decompression method can reduce the data access space, such that the inference of large-parameter models could be performed on resource-constrained edge devices. Variable-length coding is performed on all the different unrecoded sub-words in the compression manner to respectively generate different reference compression codes corresponding to all the different unrecoded sub-words. The coding length of the reference compression code corresponding to the higher second frequency is less than or equal to the coding length of the reference compression code corresponding to the lower second frequency. The bits of the different reference compression codes have a second total quantity, wherein the second total quantity is greater than the first total quantity. In fact, the reference compression code is the compression code in Table 2. According to Table 2 and paragraph [0026], the second total quantity is equal to 298. Therefore, the second total quantity is greater than the first total quantity. In Step S22, the data compression method recodes the original codewords to make the probability distribution of the sub-words more extremely uneven to further increase the compression ratio of lossless encoding.

Figure 5:
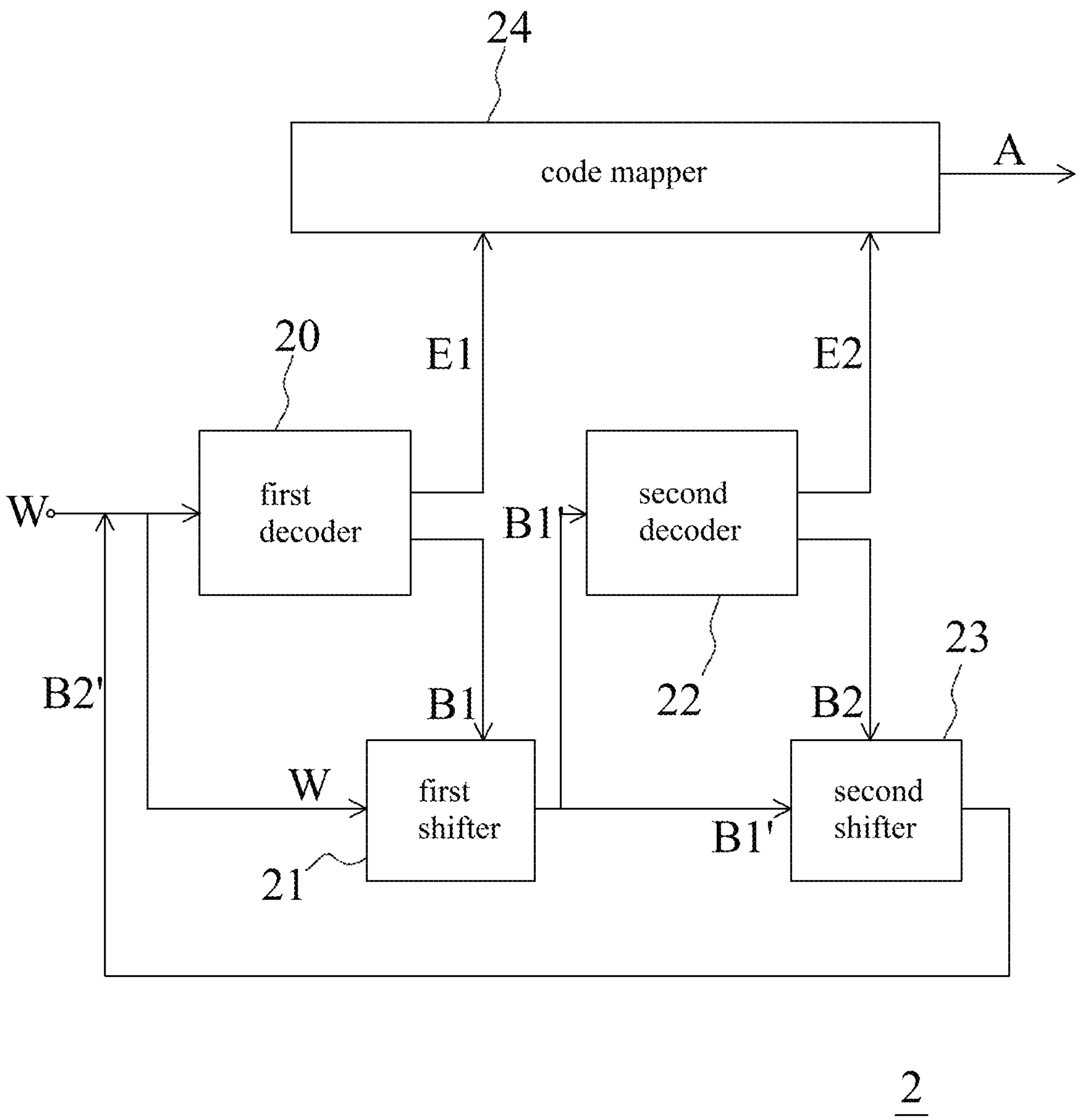
FIG. 5 is a diagram schematically illustrating a data decompression device according to another embodiment of the present invention.

FIG. 5 is a diagram schematically illustrating a data decompression device according to another embodiment of the present invention. Referring to FIG. 5, another embodiment of the data decompression device 2 is introduced as follows. The data decompression device 2 includes a first decoder 20, a first shifter 21, at least one second decoder 22, at least one second shifter 23, and a code mapper 24. For convenience and clarity, the embodiment exemplifies one second decoder 22 and one second shifter 23. The first shifter 21 is coupled to the first decoder 20. The second decoder 22 is coupled to the first shifter 21. The second shifter 23 is coupled to the first shifter 21, the second decoder 22, and the first decoder 20. The code mapper 24 is coupled to the first decoder 20 and the second decoder 22. The first decoder 20 receives the encoded codeword W, converts the first partial bits B1 of the encoded codeword W into the recoded sub-words E1 based on the corresponding relationship between the compression codes and all the different recoded sub-words, and outputs the first partial bits B1 and the recoded sub-words E1 corresponding thereto. For example, the encoded codeword W is 10110. The first decoder 20 decodes the encoded codeword W from left to right. The first partial bits B1 and the recoded sub-words E1 corresponding thereto respectively include 10 and 01. The first shifter 21 receives the encoded codeword W and removes the first partial bits B1 from the encoded codeword W to output the first remaining bits B1' of the encoded codeword W. Since the first partial bits B1 include 10, the first remaining bits B1' include 110. The second decoder 22 receives the first remaining bits B1' of the encoded codeword W and converts the second partial bits B2 of the encoded codeword W into the recoded sub-words E2 based on the corresponding relationship between the compression codes and all the different recoded sub-words, and outputs the second partial bits B2 and the recoded sub-words E2 corresponding thereto. In the embodiment, the second partial bits B2 and the recoded sub-words E2 corresponding thereto respectively include 11 and 10. The second shifter 23 receives the first remaining bits B1' of the encoded codeword W and removes the second partial bits B2 from the first remaining bits B1' of the encoded codeword W to output the second remaining bits B2' of the encoded codeword W. In the embodiment, the second remaining bits B2' include 0. Finally, according to Table 4, the code mapper 24 converts the recoded sub-words E1 and E2 into the original codeword A based on the corresponding relationship between the original codewords and all the different recoded sub-words. In the embodiment, the original codeword A is 1101.

According to the embodiments provided above, the data compression method and the decompression device compress and decompress model parameters and reduce data access space without sacrificing prediction accuracy, such that the inference of large-parameter models could be performed on resource-constrained edge devices.

The foregoing description outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A data compression method comprising:

calculating first frequencies of occurrence of different original codewords, wherein each of the original codewords has at least two sub-words and each of the sub-words has at least one bit;

decomposing each of the original codewords into the at least two sub-words and calculating second frequencies of occurrence of all the different sub-words based on the first frequencies;

performing variable-length coding on all the different sub-words in a compression manner to respectively generate different compression codes corresponding to all the different sub-words, wherein a coding length of the compression code corresponding to the higher second frequency is less than or equal to a coding length of the compression code corresponding to the lower second frequency; and respectively converting the original codewords into encoded codewords based on a corresponding relationship between the compression codes and all the different sub-words.

2. The data compression method according to claim 1, wherein the compression manner is lossless compression manner.

3. The data compression method according to claim 1, wherein the original codewords are quantized parameters of a large language model (LLM).

4. A data decompression device applied to the data compression method of claim 1, comprising:

a first decoder configured to receive the encoded codeword, convert first partial bits of the encoded codeword into the sub-words based on the corresponding relationship between the compression codes and all the different sub-words, and output the first partial bits and the sub-words corresponding thereto;

a first shifter coupled to the first decoder and configured to receive the encoded codeword and remove the first partial bits from the encoded codeword to output first remaining bits of the encoded codeword;

at least one second decoder coupled to the first shifter and the first decoder and configured to receive the first remaining bits of the encoded codeword and convert second partial bits of the encoded codeword into the sub-words based on the corresponding relationship between the compression codes and all the different sub-words, and output the second partial bits and the sub-words corresponding thereto; and at least one second shifter coupled to the first shifter, the at least one second decoder, and the first decoder and configured to receive the first remaining bits of the encoded codeword and remove the second partial bits from the first remaining bits of the encoded codeword to output second remaining bits of the encoded codeword.

5. The data decompression device according to claim 4, wherein compression codes are Huffman codes.

6. A data compression method comprising:

calculating first frequencies of occurrence of different original codewords, wherein each of the original codewords has at least two sub-words and each of the sub-words has at least one bit;

calculating second frequencies of occurrence of all the different sub-words based on the first frequencies;

recoding the sub-words of the original codewords;

decomposing each of the original codewords into the at least two recoded sub-words;

calculating third frequencies of occurrence of all the different recoded sub-words based on the first frequencies, wherein a distribution of the third frequencies corresponding to all the different recoded sub-words is more extreme than a distribution of the second frequencies corresponding to all the different unrecoded sub-words;

performing variable-length coding on all the different recoded sub-words in a compression manner to respectively generate different compression codes corresponding to all the different recoded sub-words, wherein a coding length of the compression code corresponding to the higher third frequency is less than or equal to a coding length of the compression code corresponding to the lower third frequency; and respectively converting the original codewords into encoded codewords based on a corresponding relationship between the compression codes and all the different recoded sub-words.

7. The data compression method according to claim 6, wherein bits of the different compression codes have a first total quantity, variable-length coding is performed on all the different unrecoded sub-words in the compression manner to respectively generate different reference compression codes corresponding to all the different unrecoded sub-words, a coding length of the reference compression code corresponding to the higher second frequency is less than or equal to a coding length of the reference compression code corresponding to the lower second frequency, bits of the different reference compression codes have a second total quantity, and the second total quantity is greater than the first total quantity.

8. The data compression method according to claim 6, wherein the compression manner is a lossless compression manner.

9. The data compression method according to claim 6, wherein the original codewords are quantized parameters of a large language model (LLM).

10. A data decompression device applied to the data compression method of claim 6, comprising:

a first decoder configured to receive the encoded codeword, convert first partial bits of the encoded codeword into the recoded sub-words based on the corresponding relationship between the compression codes and all the different recoded sub-words, and output the first partial bits and the recoded sub-words corresponding thereto;

a first shifter coupled to the first decoder and configured to receive the encoded codeword and remove the first partial bits from the encoded codeword to output first remaining bits of the encoded codeword;

at least one second decoder coupled to the first shifter and configured to receive the first remaining bits of the encoded codeword and convert second partial bits of the encoded codeword into the recoded sub-words based on the corresponding relationship between the compression codes and all the different recoded sub-words, and output the second partial bits and the recoded sub-words corresponding thereto;

at least one second shifter coupled to the first shifter, the at least one second decoder, and the first decoder and configured to receive the first remaining bits of the encoded codeword and remove the second partial bits from the first remaining bits of the encoded codeword to output second remaining bits of the encoded codeword; and a code mapper coupled to the first decoder and the at least one second decoder and configured to convert the recoded sub-words into the original codeword based on a corresponding relationship between the original codewords and all the different recoded sub-words.

11. The data decompression device according to claim 10, wherein compression codes are Huffman codes.

* * * * *